(12) United States Patent  
Landry

(10) Patent No.: US 8,779,413 B1  
(45) Date of Patent: Jul. 15, 2014

(54) OPTOELECTRONIC DEVICES WITH ALL-INORGANIC COLLOIDAL NANOSTRUCTURED FILMS

(71) Applicant: Sunpower Technologies, San Marcos, CA (US)

(72) Inventor: Daniel Landry, Redondo Beach, CA (US)

(73) Assignee: Sunpower Technologies LLC, San Marcos, CA (US)

( * ) Notice: Subject to any disclaimer, the term of this patent is extended or adjusted under 35 U.S.C. 154(b) by 0 days.

(21) Appl. No.: 13/755,186

(22) Filed: Jan. 31, 2013

Related U.S. Application Data

(60) Provisional application No. 61/744,953, filed on Oct. 9, 2012.

(51) Int. Cl.  
  *H01L 31/00* (2006.01)

(52) U.S. Cl.  
  USPC .......................................................... 257/21

(58) Field of Classification Search  
  USPC ............ 257/13, E33.003; 438/63, 85, 98, 97, 438/488  
  See application file for complete search history.

(56) References Cited

U.S. PATENT DOCUMENTS

| | | |
|---|---|---|
| 6,919,119 B2 | 7/2005 | Kalkan et al. |
| 8,067,259 B2 | 11/2011 | Landry et al. |
| 8,291,853 B2 | 10/2012 | Gilman |
| 2007/0006914 A1 | 1/2007 | Lee |
| 2008/0156371 A1 | 7/2008 | LoCascio et al. |
| 2011/0315959 A1 | 12/2011 | Sargent et al. |
| 2012/0104325 A1 | 5/2012 | Talapin et al. |

FOREIGN PATENT DOCUMENTS

| | | |
|---|---|---|
| EP | 2275842 | 1/2011 |
| WO | WO 2004/023527 | 3/2004 |
| WO | WO 2006/085940 | 8/2006 |

OTHER PUBLICATIONS

International Search Report and Written Opinion dated Feb. 12, 2014 corresponding to International Patent Application No. PCT/US2013/062541, 12 pages.

*Primary Examiner* — Mark A Laurenzi  
(74) *Attorney, Agent, or Firm* — Eric Sophir; Dentons US LLP

(57) ABSTRACT

Optoelectronic devices and methods of producing the same are disclosed. Methods may include forming a film from fused all-inorganic colloidal nanostructures, where the nanostructures may include inorganic nanoparticles and functional inorganic ligands, and the fused nanostructures may form an electrical network that is photoconductive. Other methods may provide an optoelectronic device which may include an integrated circuit or large panel thin-film transistor matrix, an array of conductive regions, and an optically sensitive material over at least a portion of the integrated circuit and in electrical communication with at least one conductive region of the array of conductive regions.

35 Claims, 3 Drawing Sheets

OPTOELECTRONIC DEVICES WITH ALL-INORGANIC COLLOIDAL NANOSTRUCTURED FILMS

CROSS-REFERENCE TO RELATED APPLICATIONS

This non-provisional patent application claims priority under 35 U.S.C. §119 to U.S. Provisional Patent Application No. 61/744,593, entitled "OPTOELECTRONIC DEVICES WITH ALL-INORGANIC COLLOIDAL NANOSTRUCTURED FILMS," filed on Oct. 1, 2012, which is hereby incorporated by reference in its entirety.

BACKGROUND

1. Technical Field

The present disclosure relates in general to optical and electronic devices, and more particularly, to fused films of all-inorganic colloidal semiconductor nanometer scale materials ("nanostructures") including semiconductor nanoparticles and functional inorganic ligands, which may be employed in an optoelectronic device.

2. Background Information

Digital imaging of sensed electromagnetic wavelengths is widely used in medical, military, industrial, and scientific applications. Image sensors include arrays of pixelated semiconductors and/or active pixel arrays that are optically sensitive to light (or wavelengths of electromagnetic radiation) and convert the incident photons to electrons. These photodetectors are integrated in circuit, and with other electronic circuits to convert optical signals to electronic signals, to store charge accumulated by the pixels, to transfer the charge and/or signals from the array, to convert the analog into digital signals, and to process digital data to form still or video digital images.

Examples of image sensors include devices that use silicon for sensing, read-out electronics, and multiplexing functions. In some image sensors, optically sensitive silicon photodetectors and electronics are formed on the same single silicon wafer. In other examples, larger area, flat panel image sensors consist of a large array of pixels as part of an active matrix where each pixel has a thin-film transistor (TFT) that can be externally addressed. Existing TFT array architectures can be used for larger area image sensing, however, they cannot tolerate the high temperature deposition techniques for many photodetecting semiconductor materials.

Deposition techniques for certain compound semiconductor materials are not compatible with established silicon integrated circuits. In such systems a silicon electronic read-out array and wavelength radiation sensitive photodetector arrays are fabricated separately, resulting in a complex assembly procedure, low yield, poor resolution and higher manufacturing and assembling costs. In addition, traditional manufacture of semiconductor substrates and optically sensitive semiconductor layers are limited to rigid and relatively small area optoelectronic devices.

Prior methods for solution-based nanoparticle films include volume losses of 30% or higher which may leave voids, holes, cracks and other defects in the film that negatively affect optoelectronic performance and require post-treatment to repair. All-inorganic colloidal nanostructures including semiconducting nanoparticles can be processed in solution and/or included in inks that can be deposited on a suitable substrate. This solution-processing compatibility allows post-processing atop other integrated circuits. In addition, the fabrication of optically active films using all-inorganic colloidal nanostructure inks can be achieved at low temperature to accommodate additional device structures including existing and new TFT and organic substrate, and integrated circuit materials.

In conventional methods, long-chain, organic ligands that are linked to nanoparticles are exchanged for shorter organic or volatile organic or inorganic ligands that are vaporized during a subsequent heating (annealing, sintering) step to provide a film consisting mainly of nanoparticles and being substantially free of ligands. In other conventional methods, the nanoparticle ligands may be removed by soaking the deposited layers in a solvent that dissolves and thus dissociates the ligands from the nanoparticles. These methods may often result in poor fused film qualities that are not preferential for use in optoelectronic devices, because organic ligand materials may not be removed once the nanoparticle solutions are deposited and organic ligand materials act as insulating materials in the fused films.

It would be desirable to improve existing methods for producing optoelectronic devices with all-inorganic colloidal nanostructures.

SUMMARY

Embodiments of the present disclosure provide methods for manufacturing fused films for optoelectronic devices. The fused film may incorporate an all-inorganic colloidal nanostructured layer. In addition, the all-inorganic colloidal nanostructured layer may include semiconductor nanoparticles that may be processed in a solution and formed into inks.

Nanocrystals may be synthesized in order to create the ink that may be thermally treated to form the fused film. During nanocrystal synthesis, semiconductor nanoparticles may be produced by known techniques such as batch or continuous flow wet chemistry processes. Semiconductor nanoparticles may include spherical nanometer-scale, crystalline materials and other shaped nanometer-scale, crystalline particles such as oblate and oblique spheroids, rods, wires, the like and combinations thereof. The semiconductor nanoparticles may include metal, semiconductor, oxide, metal-oxides and ferromagnetic compositions.

After nanocrystal synthesis, the semiconductor nanoparticles may be subject to ligand exchange where organic ligands may be substituted with pre-selected, functional inorganic ligands. The exchange and extraction of organic ligands may provide a solution or ink of all-inorganic colloidal nanostructures (including functional inorganic ligands and inorganic nanoparticles) that is substantially free of the organic materials. In some embodiments, the ligand exchange may involve precipitating the as-synthesized semiconductor nanoparticles from their original solution, washing, and re-dispersing in a liquid or solvent which either is or includes the ligands to be substituted onto the semiconductor nanoparticles and so completely disassociates the original ligands from the outer surfaces of the semiconductor nanoparticles and links the functional inorganic ligands to the semiconductor nanoparticles.

The functional inorganic ligands may maintain the stability of semiconductor nanoparticles in the solution and provide preferred ordering and close-packing of the semiconductor nanoparticles, without aggregation or agglomeration, via electrostatic forces. Functional inorganic ligands are interparticle media, including inorganic complexes, ions, and molecules that eliminate insulating organic ligands, stabilize the semiconductor nanoparticles in solution, facilitate close-packing between semiconductor nanoparticles, and create all-inorganic colloidal nanostructures that may be processed in solution to form all-inorganic films.

After formation of the ink including all-inorganic colloidal nanostructures, the ink may be deposited using spin-coating, spray-casting, or inkjet printing techniques on any suitable substrate conducting or insulating, crystalline or amorphous, rigid or flexible. Once deposited on the substrate, the all-inorganic nanostructured ink may be transformed into a solid, all-inorganic fused film via thermal treatment. The fused film may function as an optically active layer for optoelectronic devices based on the fused all-inorganic colloidal nanostructures incorporated into the fused film. The final material composition, size of the imbedded all-inorganic colloidal nanostructures, and the thickness of the fused film may depend on the light or wavelength region selected for detection.

According to various embodiment, aspects of the present disclosure may include an imaging system, a focal plane array which incorporates a fused film formed that may work as an optically sensitive layer formed on an underlying integrated circuit patterned to measure and relay optical signals, electronic signals, or both, on a pixel-by-pixel basis, where the signal may be indicative of light absorbed in the medium from which the focal plane array is made. The circuit may achieve multiplexing of the values read from individual pixels into row or columns of data, carried by electrodes and stored for digital imaging. Subsequent layers, typically processed from the solution phase, which, with appropriate interfacing, sensitize the underlying focal plane array to become responsive to the wavelengths absorbed by these new layers. Their resultant electronic signals may be registered and relayed using the underlying chip.

The present disclosure may provide a range of solution-processed fused films that may lie atop the underlying chip or active array. In some embodiments, the present disclosure may provide a method of sensitizing a charge-coupled device (CCD), complementary metal-oxide-semiconductor (CMOS) focal plane array, or thin-film transistor (TFT) active pixel array using all-inorganic fused films.

Furthermore, the disclosure may provide efficient, highly sensitive photo detectors based on solution-processed all-inorganic colloidal nanostructured fused films. Additionally, highly sensitive photodetectors based on a combination of two (or more) types of solution-processed all-inorganic colloidal nanostructures, each including a distinct semiconductor material, are provided. Multispectral detection of electromagnetic radiation wavelengths or ranges of wavelengths may be facilitated by incorporating various sizes of all-inorganic colloidal nanostructures within a single, continuous optically active layer within the optoelectronic device, depositing varied respective all-inorganic colloidal nanostructures per pixel and/or incorporating stacked (e.g., vertical) fused film layers having a fused all-inorganic colloidal nanostructures, where each fused film represents an optically active layer in electrical communication with at least two electrodes.

In some embodiments, the imaging devices may be efficient photoconductive optical detectors active in the x-ray, ultraviolet, visible, short-wavelength infrared, long-wavelength infrared regions of the spectrum, and are based on solution-processed nanocrystalline quantum dots. Some embodiments may have the potential to be used in creating multi-spectral, low-cost, large area, and flexible-substrate imaging systems.

In one embodiment, a film comprises fused nanostructures substantially devoid of organic material wherein the nanostructures comprise an inorganic nanoparticle fused with a functional inorganic ligand, and wherein charge carriers are mobile between the nanostructures and throughout the film.

In another embodiment, a device, comprises (a) a film comprising a network of fused all-inorganic nanostructures, wherein the nanostructures include an inorganic nanoparticle fused with a functional inorganic ligand, and wherein electrical communication exists between the nanostructures and throughout the film, and the film has substantially no defect states in the regions where the nanostructures are fused; and (b) first and second electrodes in spaced relation and in electrical communication with first and second portions of the network of fused nanostructures.

Additional features and advantages of an embodiment will be set forth in the description which follows, and in part will be apparent from the description. The objectives and other advantages of the invention will be realized and attained by the structure particularly pointed out in the exemplary embodiments in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Embodiments are described by way of example with reference to the accompanying figures which are schematic and not intended to be drawn to scale.

DETAILED DESCRIPTION

Figure 1:
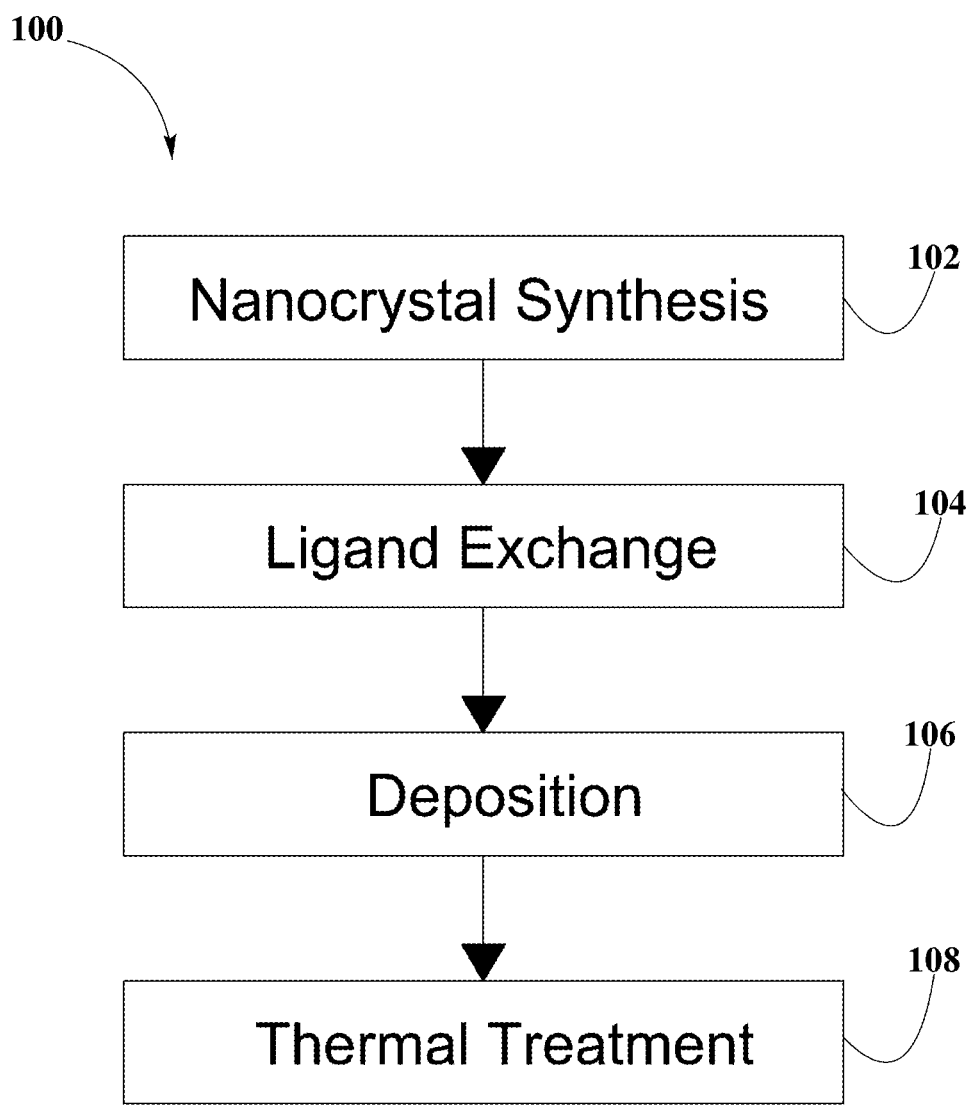
FIG. 1 is a block diagram of fused film manufacturing method, according to an embodiment.

Reference will now be made in detail to the preferred embodiments, examples of which are illustrated in the accompanying drawings. The embodiments described above are intended to be exemplary. One skilled in the art recognizes that numerous alternative components and embodiments that may be substituted for the particular examples described herein and still fall within the scope of the invention.

The present disclosure is described in detail with reference to embodiments illustrated in the drawings, which form a part hereof. In the drawings, which are not necessarily to scale or to proportion, similar symbols typically identify similar components, unless context dictates otherwise. Other embodiments may be used and/or other changes may be made without departing from the spirit or scope of the present disclosure. The illustrative embodiments described in the detailed description are not meant to be limiting of the subject matter presented.

DEFINITIONS

As used here, the following terms may have the following definitions:

"Fused film" refers to a layer of all-inorganic colloidal semiconductor nanostructures that may be converted into a solid matrix after a thermal treatment, and which may be optically active.

"Optically active" refers to a substance's ability to convert optical to electrical light.

"Semiconductor nanoparticles" refers to particles sized between about 1 and about 100 nanometers made of semiconducting materials.

The present disclosure relates to optical devices and methods of producing devices from films synthesized from all-inorganic colloidal semiconductor nanostructures. The all-inorganic colloidal semiconductor nanostructures may be fused to form nanocrystalline films ("fused films") that may be optically active and/or photoconductive and may be used in photodiodes, photodetectors, optical sensors, imaging devices, photovoltaic applications, among others. Devices incorporating the fused films may be designed to absorb specific or multiple electromagnetic wavelengths based on the design of the all-inorganic colloidal nanostructures having the fused film.

All-Inorganic Nanostructured Inks Using Inorganic Functional Ligands

FIG. 1 is a block diagram of a fused film manufacturing method 100.

In order to produce the ink for the manufacturing of fused films employed in optoelectronic devices, nanocrystal synthesis 102 may first take place. During nanocrystal synthesis 102, semiconductor nanoparticles may be produced using known techniques such as batch or continuous flow wet chemistry processes. The known synthesis techniques for colloidal nanoparticles may include capping semiconductor nanoparticle precursors in a stabilizing organic material, or organic ligands, which may prevent the agglomeration of the semiconductor nanoparticle during and after nanocrystal synthesis 102. These organic ligands are long chains radiating from the surface of the nanoparticle and may assist in the suspension and/or solubility of the nanoparticle in solvents.

Semiconductor nanoparticles employed in the present disclosure may be spherical nanometer-scale, crystalline materials, also known as semiconductor nanocrystals or quantum dots. Other shaped nanometer-scale, crystalline particles may be employed including oblate and oblique spheroids, rods, wires, and the like. Semiconductor nanoparticles may include metal, semiconductor, oxide, metal-oxides and ferromagnetic compositions. The nanoparticles may have a diameter ranging between about 1 nm and about 1000 nm, with the preferred range being between about 2 nm and about 10 nm. Due to the small size of the crystals, quantum confinement effects may manifest resulting in size, shape, and compositionally dependent optical and electronic properties, rather than the properties for the same materials in bulk scale.

Semiconductor nanoparticles may have a tunable absorption onset that has increasingly large extinction coefficients at shorter wavelengths, multiple observable excitonic peaks in the absorption spectra that correspond to the quantized electron and hole states, and narrowband tunable band-edge emission spectra. Semiconductor nanoparticles may absorb light at wavelengths shorter than the modified absorption onset and emit at the band edge. For example, using the same materials, the semiconductor nanoparticles may be manufactured to be optically sensitive to the ultraviolet, x-ray, visible, and infrared regions of the electromagnetic spectrum by manufacturing nanoparticles in different sizes.

Inorganic semiconductor nanoparticles may include II-VI, III-V, and IV-VI binary semiconductors. Examples of such binary semiconductor materials may include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, and InSb (III-V materials). In addition, the semiconductor nanoparticles may be ternary, quaternary, and quinary semiconductor nanostructures and combinations and mixtures of the materials thereof.

In some embodiments, the semiconductor nanoparticles may include core-shell type semiconductors in which the shell is one type of semiconductor and the core is another type of semiconductor, metal, oxide, and metal-oxide compounds or core-shell compositions, and mixtures thereof, which may have conductive or semi conductive properties or serve to introduce certain defect states.

Additionally, fused film manufacturing method 100 may involve ligand exchange 104, in which substitution of organic ligands with functional inorganic ligands may be achieved. Typically, functional inorganic ligands may be dissolved in a polar solvent, while organic capped semiconductor nanoparticles may be dissolved in an immiscible, generally non-polar, solvent. These two solutions may then be combined and stirred for about 10 minutes, after which a complete transfer of semiconductor nanoparticles from the non-polar solvent to the polar solvent may be observed. Immiscible solvents may facilitate a rapid and complete exchange of organic ligands with functional inorganic ligands.

Functional inorganic ligands may be soluble functional reagents that are free from organic functionality, may have a greater affinity to link to the semiconductor nanoparticles than the organic ligands, and therefore, may displace the organic ligands from organic capped semiconductor nanoparticles. Ligand exchange 104 may involve precipitating the organic capped semiconductor nanoparticles from their original solution containing organic ligands, washing, and re-dispersing in a liquid or solvent which either is or includes the functional inorganic ligands. These functional inorganic ligands may disassociate the organic ligands from the outer surfaces of the organic capped semiconductor nanoparticles and may link the functional inorganic ligands to the semiconductor nanoparticles. The functional inorganic ligands may maintain the stability of semiconductor nanoparticles in the solution and may provide preferred ordering and close-packing of the semiconductor nanoparticles without aggregation or agglomeration via electrostatic forces. Functional inorganic ligands may assist in the suspension and/or solubility of the semiconductor nanoparticle in solvents or liquids. Once applied, the functional inorganic ligands may not substantially change the optoelectronic characteristics of the semiconductor nanoparticles originally synthesized with organic ligands.

Functional inorganic ligands may include materials that are the same as the coordinated semiconductor nanoparticle or different to design and affect the electronic, optical, magnetic, or other properties for the final fused films. In some embodiments, two or more types of semiconductor nanoparticles may be separately manufactured. Each different type of semiconductor nanoparticle may be subject to the exchange of organic ligands for functional inorganic ligands and the extraction of post-exchanged organic ligands. Subsequently, the two types of semiconductor nanoparticles with functional inorganic ligands may be mixed in a solution to create a heterogeneous mixture. A plurality of semiconductor nanoparticle compositions and/or sizes may be included in the all-inorganic nanostructured ink. Functional inorganic ligands fused with semiconductor nanoparticles may have the beneficial effect of making nanostructured surfaces more stable to oxidation and photoxidation and increase material performance and longevity.

Functional inorganic ligands may include suitable elements from groups such as polyatomic anions, transition metals, lanthanides, actinides, chalcogenide molecular compounds, Zintl ions, inorganic complexes, metal-free inorganic ligands, and/or a combination including at least one of the foregoing. In some embodiments, functional inorganic ligands may be partially volatilized, where some portion of the functional inorganic ligand remains as solid state electronic material within the nanostructured ink.

Examples of polar solvents containing functional inorganic ligands may include 1,3-butanediol, acetonitrile, ammonia, benzonitrile, butanol, dimethylacetamide, dimethylamine, dimethylethylenediamine, dimethylformamide, dimethylsulfoxide (DMSO), dioxane, ethanol, ethanolamine, ethylenediamine, ethyleneglycol, formamide (FA), glycerol, methanol, methoxyethanol, methylamine, methylformamide, methylpyrrolidinone, pyridine, tetramethylethylenediamine, triethylamine, trimethylamine, trimethylethylenediamine, water, and mixtures thereof.

Examples of non-polar or organic solvents containing organic ligands may include pentane, pentanes, cyclopentane, hexane, hexanes, cyclohexane, heptane, octane, isooctane, nonane, decane, dodecane, hexadecane, benzene, 2,2,4-trimethylpentane, toluene, petroleum ether, ethyl acetate, diisopropyl ether, diethyl ether, carbon tetrachloride, carbon disulfide, and mixtures thereof; provided that organic solvent is immiscible with polar solvent. Other immiscible solvent systems that are applicable may include aqueous-fluorous, organic-fluorous, and those using ionic liquids.

The exchange and extraction of the organic ligands in ligand exchange 104 may provide a solution or ink of all-inorganic colloidal nanostructures that may be substantially free of organic materials. In some embodiments, the relative concentration of the organic ligands to the semiconductor nanoparticle in the solution of the functional inorganic ligand may be less than about 10%, 5%, 4%, 3%, 2%, 1%, 0.5% and/or 0.1% of the concentration in a solution of the semiconductor nanoparticle with the organic ligands.

Organic materials in organic ligands are known to be less stable and more susceptible to degradation via oxidation and photo-oxidation; therefore, all-inorganic materials may enhance the stability, performance and longevity of the device. In addition, organic materials may act as insulating agents that prevent the efficient transport of charge carriers between semiconductor nanoparticles, resulting in decreased device efficiencies.

Semiconductor nanoparticles with inorganic functional ligands may differ from core/shell nanoparticles where one nanoparticle has an outer crystalline layer with a different chemical formula. The crystalline layer, or shell, generally forms over the entire semiconductor nanoparticle but, as used in the present disclosure, core/shell nanoparticles may refer to those nanoparticles where at least one surface of the semiconductor nanoparticle is coated with a crystalline layer. While the functional inorganic ligands may form ordered arrays that may radiate from the surface of a semiconductor nanoparticle, these arrays may differ from a core/shell crystalline layer, as they are not permanently bound to the core semiconductor nanoparticle in the all-inorganic nanostructured ink.

After ligand exchange 104, which may form an all-inorganic nanostructured ink, the ink may undergo a deposition 106 over a substrate or may be deposited as additional layers to all-inorganic fused films. Deposition 106 techniques may include: blading, growing three-dimensional ordered arrays, spin coating, spray coating, spray pyrolysis, dipping/dip-coating, sputtering, printing, inkjet printing, stamping, the like and combinations thereof.

Following deposition 106, all-inorganic nanostructured ink may be transformed into a solid, all-inorganic fused film via thermal treatment 108. Crystalline films from all-inorganic colloidal nanostructures may be formed by a low temperature thermal treatment 108. In at least one embodiment, thermal treatment 108 of the colloidal material may include heating to a temperature less than about 350, 300, 250, 200, 150, 100 and/or 80° C. Fused film 200 may maintain approximately the same optoelectronic characteristics as the all-inorganic nanostructured ink or solution including the all-inorganic colloidal nanostructures. This may require that the fused film substantially maintains the same size and shape of the semiconductor nanoparticles that were deposited from the all-inorganic nanostructured ink. Excessive thermal treatment 108 may create fused films that do not maintain nanostructures and may result in fused films that have optoelectronic characteristics more closely performing to the respective bulk semiconductor material. Deposition 106 of all-inorganic nanostructured inks and film fusing via thermal treatment 108 to create all-inorganic nanostructured films may be performed in repetition to achieve desired film characteristics, including multiple layers, for use in optoelectronic devices.

Continuous Inorganic Fused Films from Inks Having all-Inorganic Nanostructures

Figure 2:
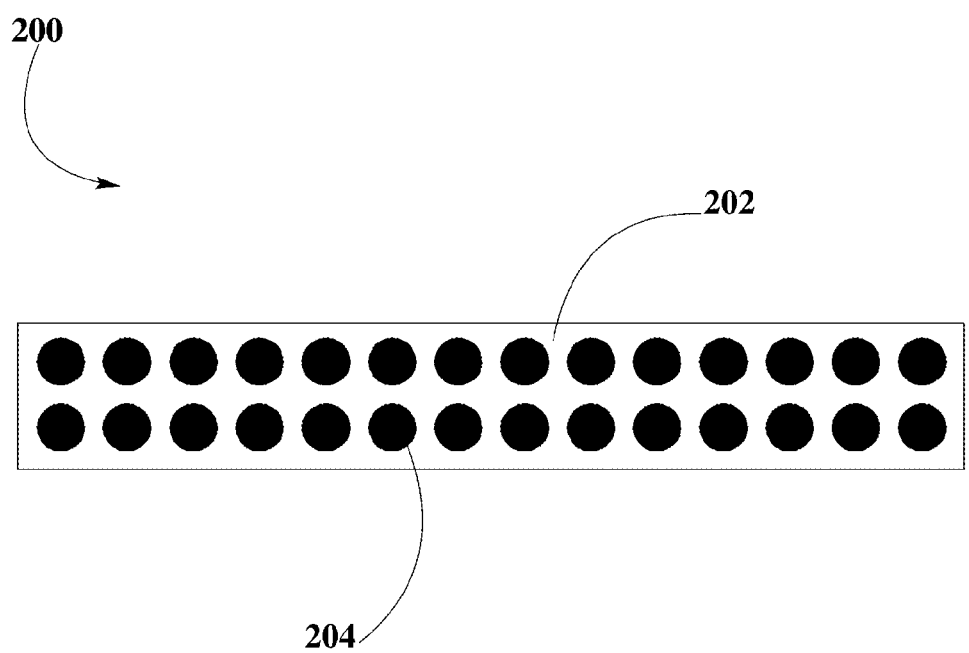
FIG. 2 shows fused film having all-inorganic colloidal nanostructures on a substrate, according to an embodiment.

FIG. 2 shows fused film 200. Fused film 200 may be enhanced as an optically active layer for finished optoelectronic devices based on fused all-inorganic colloidal nanostructures 204 integrated into fused film 200. Final material composition, size of imbedded all-inorganic colloidal nanostructures 204, and thickness of fused film 200 may be dependent on light or wavelength region selected for detection. Thickness of fused film 200 may range between about 50 nm and about 3 um, though thinner or thicker fused films 200 may be employed according to the desired functionality of the device.

The functional inorganic ligands may effectively bridge the semiconductor nanoparticles to form an electrical network and facilitate efficient electronic transport between all-inorganic colloidal nanostructures 204 within fused film 200. The fused all-inorganic colloidal nanostructures 204, and the juncture between them, may generally not have defect states, so current will flow readily between them. This aspect of fusing all-inorganic colloidal nanostructures 204, including functional inorganic ligands, may increase the electronic transport properties between all-inorganic colloidal nanostructures 204 and throughout fused film 200, providing a carrier mobility which may range within about 0.01 $cm^2$/Vs and about 80 $cm^2$/Vs. Fused film 200 having all-inorganic colloidal nanostructures 204 may also exhibit a relatively low electrical resistance above about 25 k-Ohm/square.

Nanostructured ligands remaining in the deposited all-inorganic ink/solution to form fused film 200 may not be removed, either before or as a function of the fusing steps or thermal treatment. Furthermore, inks including all-inorganic colloidal nanostructures 204 may lose less than about 20%, 15%, 10% and/or 5% of their mass upon a thermal treatment up to about 400° C. and/or 450° C.

Figure 3:
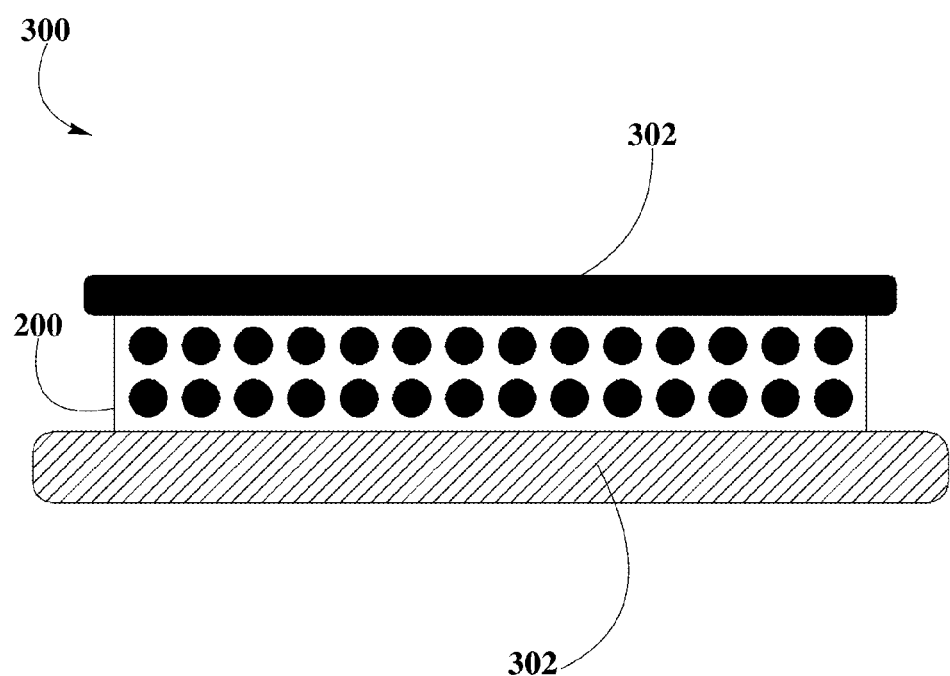
FIG. 3 depicts a fused film with an electrode, according to an embodiment.

Optical Devices with Optically Active Layers Having all-Inorganic Nanostructured Fused Films FIG. 3 depicts a fused film structure 300. Optical devices may include single image sensor chips having a plurality of pixelated metal oxide semiconductors each of which may include fused film 200 that may be optically active and at least two electrodes 302 in electrical communication with fused film 200. Size of pixels may range from less than about 1 micron square to about 1 micron square.

Other optical devices may be large-area image sensors including active pixel or matrix arrays incorporating thin film transistors (TFTs) which may include fused film 200 that is optically active and at least two electrodes 302 in electrical communication with fused film 200. Pixel size may be reduced to about 40 microns square or may be sized to accommodate the detected wavelength as required.

Current and/or voltage between electrodes 302 may be related to the amount of light absorbed by fused film 200. Photons absorbed by fused film 200 may generate electron-hole pairs and a current and/or voltage. By determining such current and/or voltage for each pixel, the image across the chip may be reconstructed via digital multiplexing and other integrated circuit components. The responsiveness of the sensor chips to different electromagnetic wavelengths may be made tunable by changing the material systems for the all-inorganic colloidal nanostructures 204 inks and/or changing the size of the all-inorganic colloidal nanostructures 204 within fused film 200 to take advantage of the quantum size effects in all-inorganic colloidal nanostructures 204 included in the ink.

Fused film 200 may be deposited and created as a monolithic layer(s) over the image sensor chip, integrated circuit, integrated circuit components, and/or TFT active matrices. Fused film 200 may be solution-deposited onto a substrate 202 or pre-fabricated CCD, CMOS, or TFT electronics.

Image sensor chip, integrated circuit, and/or TFT architecture may include one or more semiconducting materials, such as silicon, silicon-on-insulator, silicon-germanium, indium phosphide, indium gallium arsenide, gallium arsenide, or semiconducting polymers (for flexible substrate and non-planar devices). Optical device substrates 202 may also include plastic and glass. In addition, flexible substrate 202 devices may include metal foil and organic substrates.

Additional layers may be included in the layers atop the structure, including additional depositions of all-inorganic colloidal nanostructures 204 on fused film 200 to enable multispectral detection and subsequent layers of at least partially transparent electrodes. Multiple optically active layers may be layered on the image sensor substrate 202 to provide greater sensitivity for the respective wavelengths, improved imaging for multiple wavelengths, decreased complexity in device architectures (e.g., multilayer, monolithic deposition and without additional color or wavelength filters). Moreover, additional optically active layers may include additional contact electrodes per layer.

Contact electrodes 302 may be at least partially transparent and overlay all-inorganic colloidal nanostructures 204 in fused film 200. Electrode 302 materials may include aluminum, gold, platinum, silver, magnesium, copper, indium tin oxide (ITO), tin oxide, tungsten oxide, layer structures and combinations thereof.

Substrates 202 may include one or more electrodes 302, or electrodes 302 may be deposited in a later step. Optical devices may also be large-area image sensors on plastic or other flexible substrates.

The embodiments described above are intended to be exemplary. One skilled in the art recognizes that numerous alternative components and embodiments that may be substituted for the particular examples described herein and still fall within the scope of the invention.

What is claimed is:

1. A film comprising fused nanostructures substantially devoid of organic material wherein the nanostructures comprise an inorganic nanoparticle fused with a functional inorganic ligand, and wherein charge carriers are mobile between the nanostructures and throughout the film.

2. The film of claim 1, wherein the film has an optical response to irradiation in at least one of the x-ray, ultraviolet, visible, and/or infrared regions of the electromagnetic spectrum.

3. The film of claim 1, wherein the film is substantially inorganic.

4. The film of claim 1, wherein the inorganic nanoparticles and functional inorganic ligands are colloidal and included in an ink or solution that is deposited and fused, and wherein the film retains the inorganic nanoparticles and functional inorganic ligands.

5. The film of claim 1, wherein the inorganic nanoparticles maintain the same size, shape, and opto-electronic properties of the inorganic nanoparticles that were deposited from the all-inorganic nanostructure ink.

6. The film of claim 1, wherein the network of fused nanostructures defines a conductive electrical network.

7. The film of claim 1, wherein the inorganic nanoparticles include semiconductor, metal, metal-oxide, oxide and/or magnetic alloy materials and/or a combination thereof.

8. The film of claim 1, wherein the fused nanostructures includes at least one functional inorganic ligand selected from a group consisting of polyatomic anions, transition metals, lanthanides, actinides, chalcogenide molecular compounds, Zintl ions, inorganic complexes, metal-free inorganic ligands, and/or a combination thereof.

9. The film of claim 1, wherein the network of fused nanostructures includes nanoparticles of different compositions and fused functional inorganic ligands.

10. The film of claim 1, wherein the network of fused nanostructures includes nanoparticles of different sizes and fused functional inorganic ligands.

11. The film of claim 1, wherein the fused nanoparticles comprise at least one of PbS, InAs, InP, PbSe, CdS, CdSe, InGaAs, (Cd—Hg)Te, ZnSe(PbS), ZnS(CdSe), ZnSe(CdS), PbO(PbS), and PbSO(PbS).

12. The film of claim 1, wherein the optical response of the film is determined by a size and composition of the inorganic nanoparticles in the film.

13. The film of claim 1, wherein the network of fused nanostructures has an electrical resistance of at least about 25 k-Ohm/square.

14. The film of claim 1, wherein the network of fused nanostructures has a carrier mobility of between about 0.01 and about 80 $cm^2/Vs$.

15. The film of claim 1, wherein the network of fused nanostructures has a substantially linear response to irradiation in at least a portion of the electromagnetic spectrum.

16. The film of claim 1, wherein the film is disposed on a substrate.

17. The film of claim 16, wherein the substrate is flexible and formed in a non-planar shape.

18. The film of claim 16, wherein the substrate comprises an integrated circuit and/or a thin-film transistor array, at least some components of which are in electrical communication with the film.

19. The film of claim 16, wherein the substrate comprises at least one of a semiconducting organic molecule, a semiconducting polymer, a nanocrystalline semiconductor, an amorphous semiconductor, or a crystalline semiconductor.

20. A device comprising:
    a film comprising a network of fused all-inorganic nanostructures, wherein the nanostructures include an inorganic nanoparticle fused with a functional inorganic ligand, and wherein electrical communication exists between the nanostructures and throughout the film, and the film has substantially no defect states in the regions where the nanostructures are fused; and
    first and second electrodes in spaced relation and in electrical communication with first and second portions of the network of fused nanostructures.

21. The device of claim 20, wherein the film includes inorganic nanoparticles and functional inorganic ligands.

22. The device of claim 20, wherein an outer surface includes at least one defect state.

23. The device of claim 22, wherein the at least one defect state comprises at least one trap state for a hole during operation of the optical device.

24. The device of claim 20, wherein the electrical network of fused structures provides a plurality of low-resistance electrical paths from the first electrode to the second electrode.

25. The device of claim 24, wherein the film has an electrical resistance of at least about 25 k-Ohm/square.

26. The device of claim 20, wherein an electrical resistance of the film changes in response to irradiation by light.

27. The device of claim 20, wherein the network of fused nanostructures provides a plurality of electrical paths from the first electrode to the second electrode and wherein at least some of those electrical paths undergo a change in electrical resistance in response to incident light.

28. The device of claim 20, wherein the film has a carrier mobility of between about 0.01 $cm^2/Vs$ and about 80 $cm^2/Vs$.

29. The device of claim 20, wherein the fused nanostructures comprise a plurality of a first type of fused nanostructures and a plurality of a second type of fused nanostructures.

30. The device of claim 29, wherein the functional inorganic ligands of each of the first type of fused nanostructure is in direct physical contact and electrical communication with the functional inorganic ligands of another of the first type of fused nanostructures.

31. The device of claim 30, wherein the functional inorganic ligands of each of the second type of fused nanostructure is in direct physical contact and electrical communication with the functional inorganic ligands of another of the second type of fused nanostructures.

32. The device of claim 20, wherein each fused nanostructure is of a size and composition to absorb at least one of x-ray, ultraviolet, visible, and/or infrared regions of electromagnetic radiation.

33. The device of claim 20, wherein the first and second electrodes are disposed on a substrate with the film between and substantially parallel to one another.

34. The device of claim 20, wherein the first and second electrodes are disposed on a substrate with the film between and are interdigitated.

35. The device of claim 20, wherein the first and second electrodes are spaced by about 0.2 μm to about 3 μm from each other.

* * * * *